United States Patent [19]
Yokote et al.

[11] Patent Number: 5,471,603
[45] Date of Patent: Nov. 28, 1995

[54] MODULAR HIGH-CAPACITY SOLID-STATE MASS DATA STORAGE DEVICE INCLUDING CONTROLLER/MEMORY MODULES ARRANGED IN PARALLEL CHANNELS

[75] Inventors: Timothy A. Yokote, Torrance; Eric L. Upton; Arthur G. Enyedy, both of Redondo Beach; Grant J. Stockton, Long Beach; Dirk K. Brandis, Hermosa Beach, all of Calif.

[73] Assignee: TRW Inc., Redondo Beach, Calif.

[21] Appl. No.: 963,192

[22] Filed: Oct. 19, 1992

Related U.S. Application Data

[63] Continuation-in-part of Ser. No. 744,050, Aug. 12, 1991, Pat. No. 5,289,377.
[51] Int. Cl.$^6$ ............................. G06F 13/00; G06F 13/12
[52] U.S. Cl. .................. 395/402; 395/500; 395/432; 395/442; 395/496; 371/68.1; 364/DIG. 1; 364/238.4; 364/243.7; 364/926.92
[58] Field of Search ..................... 395/425, 500, 395/800; 371/21.1, 21.2, 10.1, 10.2, 68.1, 68.2, 68.3; 364/424.04, 424.06; 365/200

[56] References Cited

U.S. PATENT DOCUMENTS

| | | | |
|---|---|---|---|
| 4,089,063 | 5/1978 | Takezono et al. | 395/425 |
| 4,970,648 | 11/1990 | Capots | 364/424.06 |
| 5,243,699 | 9/1993 | Nickolls et al. | 395/275 |

*Primary Examiner*—Glenn Gossage

[57] ABSTRACT

A modular solid-state mass data storage device providing high-density, high-capacity storage of data employs a modular pipeline architecture in which a distributed array of controller/memory modules is arranged in parallel controller/memory channels on one or more controller/memory cards, each controller/memory channel having first and last controller/memory modules. The modular storage device also includes a data format module, and first and second busses connecting outputs of the data format module to inputs of each of the first and last controller/memory modules. The first bus also connects outputs of the last controller/memory module in each channel back to an input of the data format modules. The modular pipeline architecture allows the number of controller/memory modules in each channel to be easily configured to accommodate any required storage size, while the number of controller/memory channels can be configured to accommodate any required storage size and transfer rate, without increasing latency time. The modular pipeline architecture also greatly simplifies the complexity of the memory controllers, and high-density packaging of the controller/memory modules provides compact storage for large amounts of data. The mass data storage device may be used as a random access memory (RAM) disk or for any other application requiring high-density, high-capacity mass data storage devices.

11 Claims, 2 Drawing Sheets

MODULAR HIGH-CAPACITY SOLID-STATE MASS DATA STORAGE DEVICE INCLUDING CONTROLLER/MEMORY MODULES ARRANGED IN PARALLEL CHANNELS

This application is a continuation-in-part of a application by two of the same inventors entitled "Fault-Tolerant Solid-State Flight Data Recorder," Ser. No. 07/744,050, and filed on Aug. 12, 1991 now U.S. Pat. No. 5,289,377.

BACKGROUND OF THE INVENTION

This invention relates generally to mass data storage devices and, more particularly, to solid-state random access memory (RAM) mass data storage devices.

Many computer applications, such as graphics imaging and animation, seismic data processing, weather forecasting, design automation, and scientific simulation, require large system memories for processing. The system or main memory of a computer is typically a limited array of solid-state static and/or dynamic random access memory (SRAM and/or DRAM) chips which provides temporary storage for applications programs and data during processing. A rotating magnetic memory, such as a hard disk, is typically used for permanent storage of the programs and data because it is nonvolatile and less costly per megabyte than solid-state random access memory (RAM).

Various techniques have been developed to overcome the restrictions imposed by the limited size of main memories. One such technique is virtual memory, which is a memory addressing technique that allows a computer to function as if it has more main memory than it really does. Virtual memory stores some parts of the applications programs and data on hard disk and some parts in the actual or physical main memory. When particular program instructions or data are needed that are not in the physical main memory, the instructions or data are loaded from the hard disk. However, hard disks have much slower access times than solid-state RAM memories, and latency time is significantly increased with this technique.

As refinements in semiconductor fabrication techniques have reduced the unit cost and increased the unit density of solid-state RAM memory devices, solid-state memory devices have been increasingly used in applications that were once the domain of hard disks. One such application is a solid-state mass data storage device that is configured as a RAM disk. A RAM disk emulates a hard disk and effectively allows virtual memory to be stored in solid-state RAM memory, thus significantly decreasing latency time. However, solid-state mass data storages devices do not presently provide the high densities and large memory capacities that are required for many computer applications. Accordingly, there has been a need for a high-density, high-capacity solid-state mass data storage device. The present invention clearly fulfills this need.

SUMMARY OF THE INVENTION

The present invention resides in a modular solid-state mass data storage device providing high-density, high-capacity storage of data. The mass data storage device employs a modular pipeline architecture in which a distributed array of controller/memory modules is arranged in parallel controller/memory channels on one or more controller/memory cards. The modular pipe-line architecture allows the number of controller/memory modules in each channel to be easily configured to accommodate any required storage size, while the number of controller/memory channels can be configured to accommodate any required storage size and transfer rate, without increasing latency time. The modular pipeline architecture also greatly simplifies the complexity of the memory controllers, and high-density packaging of the controller/memory modules provides compact storage for large amounts of data. The mass data storage device of the present invention can be configured for use as a RAM disk or for any other application requiring high-density, high-capacity mass data storage devices.

The mass data storage device of the present invention includes one or more controller/memory cards which plug into a backplane through a backplane interface. Each controller/memory card includes a distributed array of controller/memory modules which are arranged in parallel controller/memory channels. In each channel, the controller/memory modules are connected to first and second buses which extend from a data format module. The first bus also extends from the last controller/memory module in each channel back to the data format module. The data format module provides data formatting, synchronization and error correction for the data stored in the modules.

Each controller/memory module includes a memory controller and an array of solid-state random access memory (RAM) chips, such as dynamic random access memory (DRAM) chips. The memory controller performs all of the basic control functions necessary for accessing the DRAM chips, including controlling and addressing the DRAM chips for read/write operations and refreshing the DRAM chips. Each DRAM chip is connected to a memory controller and each memory controller is connected to the other memory controllers in the same channel by the first and second buses. The first bus includes a read data bus and the second bus includes a read address bus, a write address bus, a write data bus and a control bus.

The read and write buses use a pipeline architecture for both data and address transfers. For the write operation, the write addresses on the write address bus and the data on the write data bus are clocked through the memory controllers in a particular channel until an address matches the write location. The data is then written into that location in the DRAM chip. For the read operation, the read addresses on the read address bus are clocked through the memory controllers in a particular channel until an address matches the read location. The data is retrieved and then clocked on through the remaining memory controllers in that channel on the read data bus back to the data format module.

It will be appreciated from the foregoing that the present invention represents a significant advance in the field of mass data storage devices. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
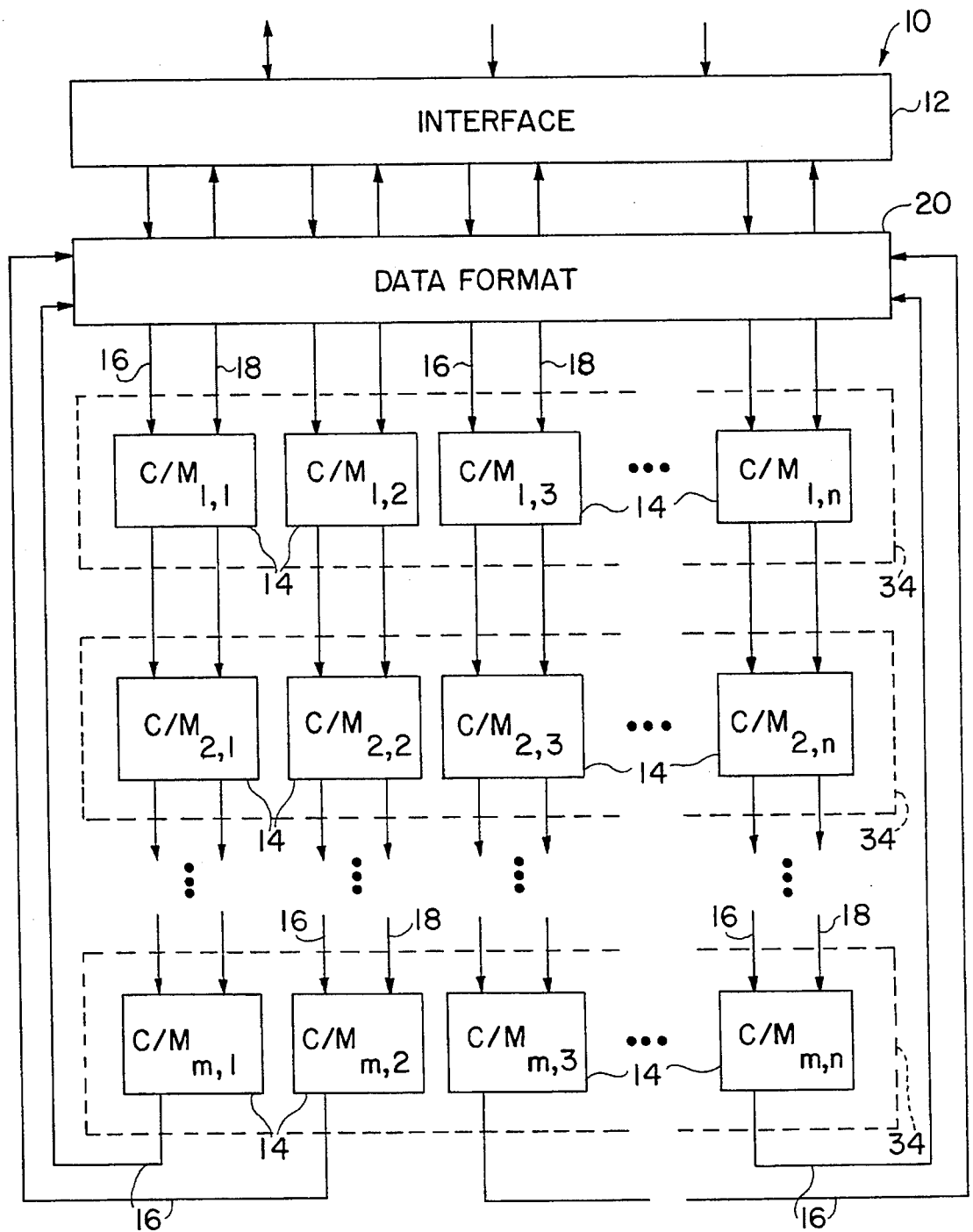
FIG. 1 is a block diagram of a modular, high-capacity solid-state mass data storage device in accordance with the present invention.

As shown in the drawings for purposes of illustration, the present invention is embodied in a modular solid-state mass data storage device providing high-density, high-capacity storage of data. The mass data storage device employs a modular pipeline architecture in which a distributed array of controller/memory modules is arranged in parallel controller/memory channels on one or more controller/memory cards. The modular pipeline architecture allows the number of controller/memory modules in each channel to be easily configured to accommodate any required storage size, while the number of controller/memory channels can be configured to accommodate any required storage size and transfer rate, without increasing latency time. The modular pipeline architecture also greatly simplifies the complexity of the memory controllers, and high-density packaging of the controller/memory modules provides compact storage for large amounts of data. The mass data storage device of the present invention can be configured for use as a RAM disk or for any other application requiring high-density, high-capacity mass data storage devices.

As illustrated in FIG. 1, the mass data storage device of the present invention includes one or more controller/memory cards 10 which plug into a backplane through a backplane interface 12. Each controller/memory card 10 includes a distributed array of controller/memory modules 14 which are arranged in parallel controller/memory channels. In each channel, the controller/memory modules 14 are connected to first and second buses 16, 18 which extend from a data format module 20. The first bus 16 also extends from the last controller/memory module 14 in each channel back to the data format module 20. The data format module 20 provides data formatting, synchronization and error correction for the data stored in the modules 14. The modular pipeline architecture of the controller/memory channels allows the number of controller/memory modules 14 in each channel to be easily configured to accommodate any required storage size, while the number of controller/memory channels can be configured to accommodate any required storage size and transfer rate, without increasing latency time.

Figure 2:
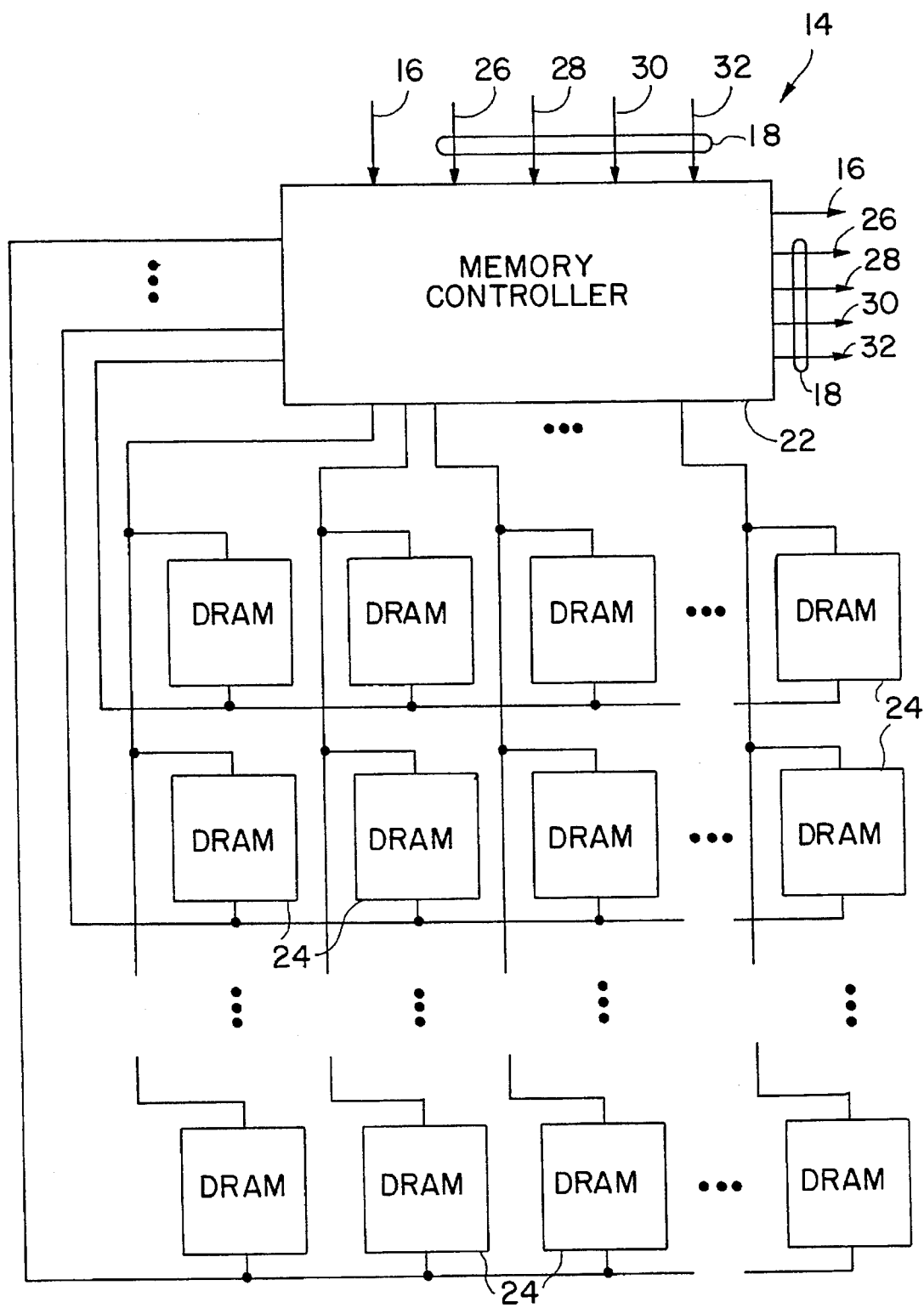
FIG. 2 is a block diagram of a controller/memory module in the mass data storage device of the present invention.

As illustrated in FIG. 2, each controller/memory module 14 includes a memory controller 22 and an array of solid-state random access memory (RAM) chips 24, such as dynamic random access memory (DRAM) chips. The memory controller 22, which can be greatly simplified because of the pipeline architecture of the present invention, performs all of the basic control functions necessary for accessing the DRAM chips 24. These functions include controlling and addressing the DRAM chips for read/write operations and refreshing the DRAM chips. Each DRAM chip 24 is connected to a memory controller 22 and each memory controller 22 is connected to the other memory controllers in the same channel by the first and second buses 16, 18. The first bus 16 includes a read data bus and the second bus 18 includes a read address bus 26, a write address bus 28, a write data bus 30 and a control bus 32.

The read and write buses use a pipeline architecture for both data and address transfers. For the write operation, the write addresses on the write address bus 28 and the data on the write data bus 30 are clocked through the memory controllers 22 in a particular channel until an address matches the write location. The data is then written into that location in the DRAM chip. For the read operation, the read addresses on the read address bus 26 are clocked through the memory controllers 22 in a particular channel until an address matches the read location. The data is retrieved and then clocked on through the remaining memory controllers 22 in that channel on the read data bus 16 back to the data format module 20.

In a preferred embodiment of the present invention that is configured as a RAM disk, each controller/memory card 10 includes four parallel controller/memory channels. Each controller/memory module 14 includes an 8×4 array of 4 megabit (Mbit) (4×1024K) DRAM chips 24 for a total memory capacity per module of 16 Mbytes. The DRAM chips 24 can be easily upgraded to higher capacity chips, such as 16 Mbit DRAM chips. The memory controller 22 can either be programmed beforehand for the higher capacity DRAM chips or the memory controller 22 can be replaced. The memory controller 22 includes a built in memory test and bypass.

The read and write buses are eight bit buses which are demultiplexed at a ratio of 1:4 and multiplexed at a ratio of 4:1 to reduce system interconnects and memory controller input/output. An internal word format of 8, 16, 24 or 32 bits can be used. Each controller/memory module 14 provides a data transfer rate of up to 25 megabytes/second (Mbytes/sec), either randomly or using sequential block access. The controller/memory modules 14 are completely synchronous with all read and write data transfers and the read and write addresses are synchronously clocked. Latency time to any address is less than 10 microseconds.

Referring to FIGS. 1 and 2, four parallel controller/memory modules 14 are preferably packaged in a high-density single in-line memory module (SIMM) module 34 for a total memory capacity per SIMM module of 64 Mbytes. The memory controllers 22 are mounted on one side of the SIMM module 34 and the DRAM chips 24 are mounted on the other side. Each SIMM module 34 is programmable for an 8, 16, 24, 32, 64 or 128 bit word format and each module 34 provides a data transfer rate of up to 100 Mbytes/sec. Simultaneous read and write operations to different controller/memory modules 14 in a SIMM module 34 are possible. Each controller/memory card 10 includes twenty SIMM modules 34 for a total memory capacity of 1.25 gigabytes (Gbytes) with single error correction or 1.0 Gbyte with double error correction. The error correction is user selectable. The RAM disk, which preferably uses a Versa Module Eurocard bus (VMEbus) backplane, includes up to ten controller/memory cards 10, providing a total memory capacity of 12.5 Gbytes.

The data stored in the RAM disk is word or block addressable beyond the typical system address limit, providing flexibility in accessing the stored data. Large block sizes are preferable for data compression algorithms. A variety of interfaces are possible with the VMEbus backplane, such as a small computer system interface (SCSI), which allows the RAM disk to be connected to a variety of personal computers, workstations, minicomputers and mainframe computers.

In another preferred embodiment of the invention, each controller/memory card 10 includes eight parallel controller/memory channels. Each controller/memory module 14 has a total memory capacity of 16 Mbytes and every eight parallel controller/memory modules 14 are packaged in two SIMM modules 34, for a data transfer rate of up to 200 Mbytes/sec.

From the foregoing, it will be appreciated that the present invention represents a significant advance in the field of mass data storage devices. Although several preferred embodiments of the invention have been shown and described, it will be apparent that other adaptations and modifications can be made without departing from the spirit and scope of the invention. For example, the invention can be used as a high-resolution video preview device when combined with a frame buffer and digital-to-analog converter. The video preview device, with 12.5 Gbytes of mass data storage memory, can provide up to 142 seconds of continuous video with 1280 lines×1024 pixel resolution and 24 bit color at 24 frames/sec or 114 seconds at 30 frames/sec. Accordingly, the invention is not to be limited, except as by the following claims.

We claim:

1. A modular solid-state mass data storage device providing high-density, high capacity storage of data, comprising:

first and second parallel controller/memory channels, each including first and last controller/memory modules;

a data format module;

first and second busses connecting outputs of said data format module to inputs of each of said first and last controller/memory modules, the first bus also connecting outputs of the last controller/memory module in each channel back to an input of the data format module, wherein each controller/memory module includes a memory controller coupled to an array of random access memory chips, and wherein each memory controller performs at least one of addressing said RAM chips for a read operation, addressing said RAM chips for a write operation, and refreshing said RAM chips.

2. The mass data storage device as set forth in claim 1, wherein the data format module provides data formatting, synchronization and error correction for data stored in the controller/memory modules.

3. The mass data storage device as set forth in claim 1, wherein each RAM chip is connected to a memory controller and the memory controller is connected to the other memory controllers in the same channel by the first and second buses.

4. The mass data storage device as set forth in claim 3, wherein the first bus includes a read data bus and the second bus includes a read address bus, a write address bus, a write data bus and a control bus.

5. The mass data storage device as set forth in claim 4, wherein during said write operation, write addresses on the write address bus and write data on the write data bus are clocked through the memory controllers in one of said controller/memory channels until one of said write addresses matches a write location, and wherein the write data is then written into the write location in one of said RAM chips.

6. The mass data storage device as set forth in claim 4, wherein during said read operation, read addresses on the read address bus are clocked through the memory controller in one of said controller/memory channels until one of said read addresses matches a read location, and wherein read data in one of said RAM chips identified by said one of said read addresses is retrieved and then clocked through the remaining memory controllers in said one of said controller/memory channels on the read data bus back to the data format module.

7. The mass data storage device as set forth in claim 1, wherein the mass data storage device is configured as a random access memory (RAM) disk which emulates a hard disk.

8. The mass data storage device as set forth in claim 7, wherein the mass data storage device includes four controller/memory channels and each controller/memory module has a memory capacity of 16 megabytes (Mbytes).

9. The mass data storage device as set forth in claim 8, wherein every four parallel controller/memory modules are packaged in a single in-line memory module.

10. The mass data storage device as set forth in claim 7, wherein the mass data storage device includes eight controller/memory channels and each controller/memory module has a capacity of 16 Mbytes.

11. The mass data storage device as set forth in claim 10, wherein every four parallel controller/memory modules are packaged in a single in-line memory module.

* * * * *